(12) United States Patent
Bertin et al.

(10) Patent No.: US 7,944,735 B2
(45) Date of Patent: May 17, 2011

(54) METHOD OF MAKING A NANOTUBE-BASED SHADOW RANDOM ACCESS MEMORY

(75) Inventors: Claude L. Bertin, Venice, FL (US);
Thomas Rueckes, Rockport, MA (US);
Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 12/550,975

(22) Filed: Aug. 31, 2009

(65) Prior Publication Data

US 2010/0005645 A1 Jan. 14, 2010

Related U.S. Application Data

(60) Division of application No. 11/879,352, filed on Jul. 17, 2007, now Pat. No. 7,583,526, which is a continuation-in-part of application No. 10/918,085, filed on Aug. 13, 2004, now Pat. No. 6,990,009, said application No. 11/879,352 is a continuation of application No. 11/231,213, filed on Sep. 20, 2005, now Pat. No. 7,254,520.

(60) Provisional application No. 60/494,889, filed on Aug. 13, 2003, provisional application No. 60/561,330, filed on Apr. 12, 2004, provisional application No. 60/612,300, filed on Sep. 22, 2004.

(51) Int. Cl.
*G11C 14/00* (2006.01)
(52) U.S. Cl. ........ 365/156; 365/154; 365/151; 365/164; 977/938; 977/936; 977/943
(58) Field of Classification Search .................. 365/156, 365/154, 151, 166, 164; 977/943, 938, 936
See application file for complete search history.

(56) References Cited

U.S. PATENT DOCUMENTS

| 4,128,773 | A | * | 12/1978 | Troutman et al. | ........ 365/185.07 |
| 4,168,537 | A | * | 9/1979 | Uchida | ........ 365/154 |
| 4,403,306 | A | * | 9/1983 | Tokushige et al. | ........ 365/156 |
| 6,128,243 | A | * | 10/2000 | Chan et al. | ........ 365/227 |
| 6,888,773 | B2 | | 5/2005 | Morimoto | |
| 6,890,780 | B2 | | 5/2005 | Lee | |

(Continued)

OTHER PUBLICATIONS

Novak, J.P. et al. "Nerve agent detection using networks of single-walled carbon nanotubes," Applied Physics Letters, vol. 83, No. 19, Nov. 10, 2003, pp. 4026-4028.

(Continued)

*Primary Examiner* — Andrew Q Tran
(74) *Attorney, Agent, or Firm* — Wilmer Cutler Pickering Hale and Dorr LLP

(57) ABSTRACT

Random access memory including nanotube switching elements. A memory cell includes first and second nanotube switching elements and an electronic memory. Each nanotube switching element includes conductive terminals, a nanotube article and control circuitry capable of controllably form and unform an electrically conductive channel between the conductive terminals. The electronic memory is a volatile storage device capable of storing a logic state in response to electrical stimulus. In certain embodiment the electronic memory has cross-coupled first and second inverters in electrical communication with the first and second nanotube switching elements. The cell can operate as a normal electronic memory, or can operate in a shadow memory or store mode (e.g., when power is interrupted) to transfer the electronic memory state to the nanotube switching elements. The device may later be operated in a recall mode where the state of the nanotube switching elements may be transferred to the electronic memory.

7 Claims, 3 Drawing Sheets

U.S. PATENT DOCUMENTS

| | | |
|---|---|---|
| 6,905,892 B2 | 6/2005 | Esmark et al. |
| 6,919,592 B2 | 7/2005 | Segal et al. |
| 7,161,403 B2 | 1/2007 | Bertin |
| 2004/0031975 A1 | 2/2004 | Kern et al. |
| 2004/0132070 A1 | 7/2004 | Star et al. |
| 2004/0266106 A1 | 12/2004 | Lee |
| 2005/0037547 A1* | 2/2005 | Bertin et al. .......... 438/142 |
| 2005/0212014 A1 | 9/2005 | Horibe et al. |
| 2006/0258122 A1 | 11/2006 | Whitefield et al. |
| 2006/0264053 A1 | 11/2006 | Yates |
| 2006/0281256 A1 | 12/2006 | Carter et al. |
| 2006/0281287 A1 | 12/2006 | Yates et al. |
| 2006/0292716 A1 | 12/2006 | Gu et al. |

OTHER PUBLICATIONS

Snow, E.S. et al., "Random networks of carbon nanotubes as an electronic material," Applied Physics Letters, vol. 82, No. 13, Mar. 31, 2003, pp. 2145-2147.

Star, A. et al., "Nanoelectronic Carbon Dioxide Sensors," Adv. Mater. 2004, 16, No. 22, Nov. 18, pp. 2049-2052.

Star, A. et al., "Nanotube Optoelectronic Memory Devices," Nano Letters, 2004, vol. 4, No. 9, pp. 1587-1591.

Zhou, Y. et al., "p-Channel, n-Channel Thin Film Transistors and p-n Diodes Based on Single Wall Carbon Nanotube Networks," Nano Letters, 2004, vol. 4, No. 10, pp. 2031-2035.

* cited by examiner

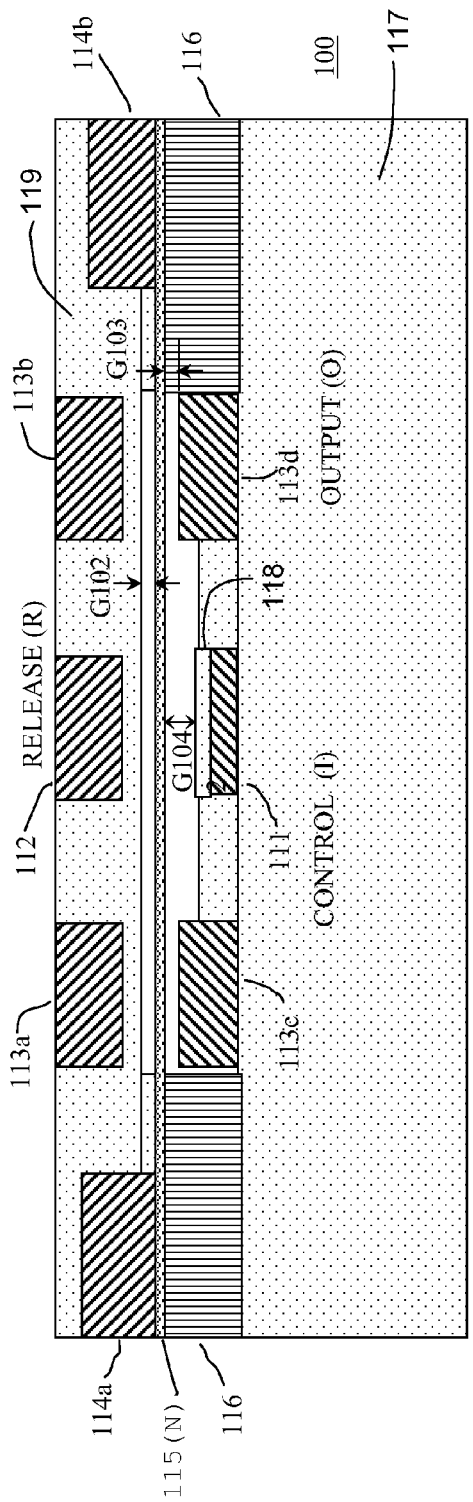
Figure 1A: NT Device Cross Section – Suspended Region
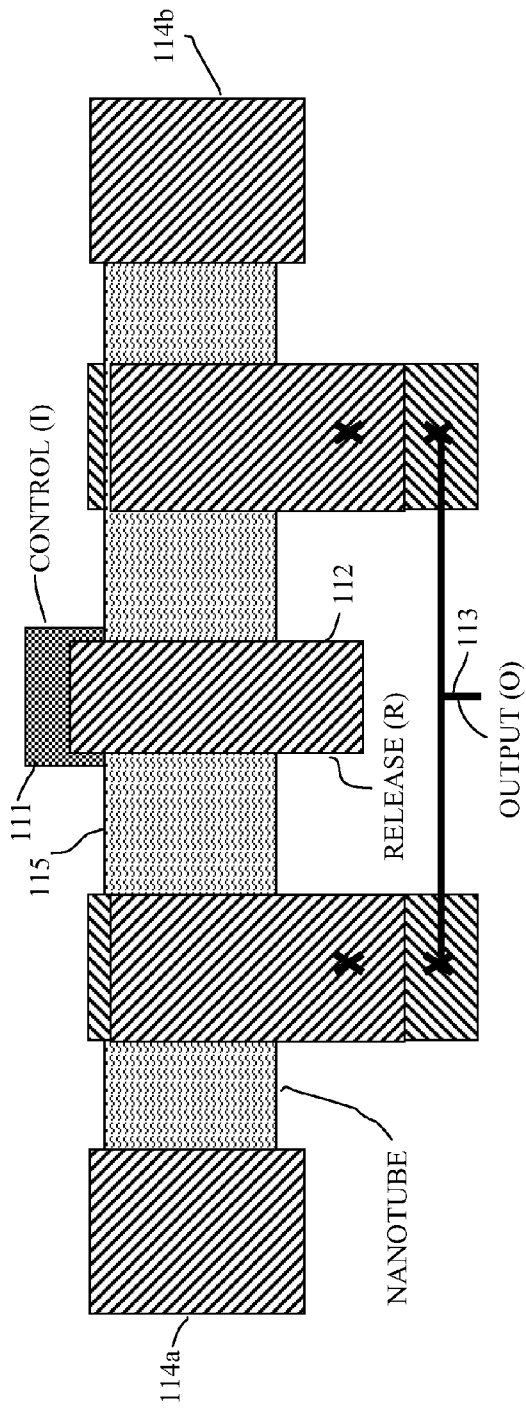
Figure 1B: NT Device – Top View – Suspended Region

METHOD OF MAKING A NANOTUBE-BASED SHADOW RANDOM ACCESS MEMORY

CROSS-REFERENCE TO RELATED APPLICATIONS

This application is a divisional of and claims priority under 35 U.S.C. §120 to U.S. patent application Ser. No. 11/879,352, now U.S. Pat. No. 7,583,526, filed on Jul. 17, 2007, entitled Random Access Memory Including Nanotube Switching Elements, the entire contents of which are incorporated herein by reference, which is a continuation of and claims priority under 35 U.S.C. §120 to U.S. patent application Ser. No. 11/231,213, now U.S. Pat. No. 7,245,520, filed on Sep. 20, 2005, entitled Random Access Memory Including Nanotube Switching Elements, which claims priority under 35 U.S.C. §119(e) to U.S. Provisional Application No. 60/612,300 filed on Sep. 22, 2004, entitled Random Access Memory Including Nanotube Switching Elements, which is incorporated herein by reference in its entirety, and which is also a continuation-in-part of and claims priority under 35 U.S.C. §120 to U.S. patent application Ser. No. 10/918,085, now U.S. Pat. No. 6,990,009, filed on Aug. 13, 2004, entitled Nanotube-Based Switching Elements with Multiple Controls, which claims priority under 35 U.S.C. §119(e) to U.S. Provisional Application No. 60/561,330 filed Apr. 12, 2004, entitled Nanotube-Based Switching Elements with Multiple Controls, and to U.S. Provisional Application No. 60/494,889 filed on Aug. 13, 2003, entitled Nanoelectromechanical Nanotube-Based Logic, both of which are also incorporated herein by reference in its entirety.

BACKGROUND

1. Technical Field

The present application generally relates to nanotube switching circuits and in particular to nanotube switching circuits that can be used to provide non-volatile storage functionality to otherwise conventional random access memory (RAM).

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or extreme environments. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to certain extreme environments because electrical currents are generated inside the semiconductor material. It is possible to manufacture integrated circuits with special devices and isolation techniques so that they remain operational when exposed to such environments, but the high cost of these devices limits their availability and practicality. In addition, such digital circuits exhibit timing differences from their normal counterparts, requiring additional design verification to add protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul. 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Patent Publication No. 2003-0021966 discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Patent Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which the two of the traces are electrodes to control the deflection of the ribbon.

The use of an electromechanical bi-stable device for digital information storage has also been suggested (c.f. U.S. Pat. No. 4,979,149: Non-volatile memory device including a micro-mechanical storage element).

The creation and operation of bi-stable, nano-electro-mechanical switches based on carbon nanotubes (including mono-layers constructed thereof) and metal electrodes has been detailed in a previous patent application of Nantero, Inc. (U.S. Pat. Nos. 6,574,130, 6,643,165, 6,706,402, 6,784,028, 6,835,591, 6,911,682, 6,919,592, and 6,924,538; and U.S. patent application Ser. Nos. 10/341,005, 10/341,055, 10/341,054, 10/341,130, and 10/776,059, the contents of which are hereby incorporated by reference in their entireties).

SUMMARY

The present invention provides random access memory including nanotube switching elements.

Under one aspect of the invention a memory cell includes first and second nanotube switching elements and an electronic memory. Each nanotube switching element includes an output node, a nanotube channel element having at least one electrically conductive nanotube, and a control structure having a set electrode and a release electrode disposed in relation to the nanotube channel element to controllably form and unform an electrically conductive channel between said channel electrode and said output node. The electronic memory has cross-coupled first and second inverters. The input node of the first inverter is coupled to the set electrode of the first nanotube switching element and to the output node of the second nanotube switching element. The input node of the of the second inverter is coupled to the set electrode of the second nanotube switching element and to the output node of the first nanotube switching element; and the channel electrode is coupled to a channel voltage line.

Under another aspect of the invention, the release electrode of the first nanotube switching element is coupled to the release electrode of the second nanotube switching element and wherein both release electrodes are coupled to a release line.

Under another aspect of the invention, the first and second inverters are CMOS inverters.

Under another aspect of the invention, the first and second nanotube switching elements are non-volatile state devices.

Under another aspect of the invention, the first and second nanotube switching elements are fabricated in circuit layers above circuit layers used to fabricate the electronic memory.

Under another aspect of the invention, the channel voltage line is set to one-half the supply voltage used by the electronic memory, when the circuit operates in an electronic memory mode. The channel voltage line is set to nanotube channel switching voltage, when the circuit operates in a shadow memory mode. In shadow memory mode, the state of the electronic memory transfers to the state of the nanotube switching elements.

Under another aspect of the invention, the channel voltage line is set to the supply voltage used by the electronic memory, when the circuit operates in a recall mode. In the recall mode the state of the nanotube switching elements transfers to the state of the electronic memory.

Under another aspect of the invention, the release electrode of the first nanotube switching element is coupled to the release electrode of the second nanotube switching element and both are coupled to a release line. After the recall mode transfers the state of the nanotube switching elements to the state of the electronic memory, the release line is activated to reset the state of the nanotube switching elements.

BRIEF DESCRIPTION OF THE DRAWINGS

In the Drawing,

FIGS. 1A-1D illustrate cross-sectional views and a plan view of a nanotube switching element of certain embodiments in two different states and include a plan view of such element;

DETAILED DESCRIPTION

Figure 1C:
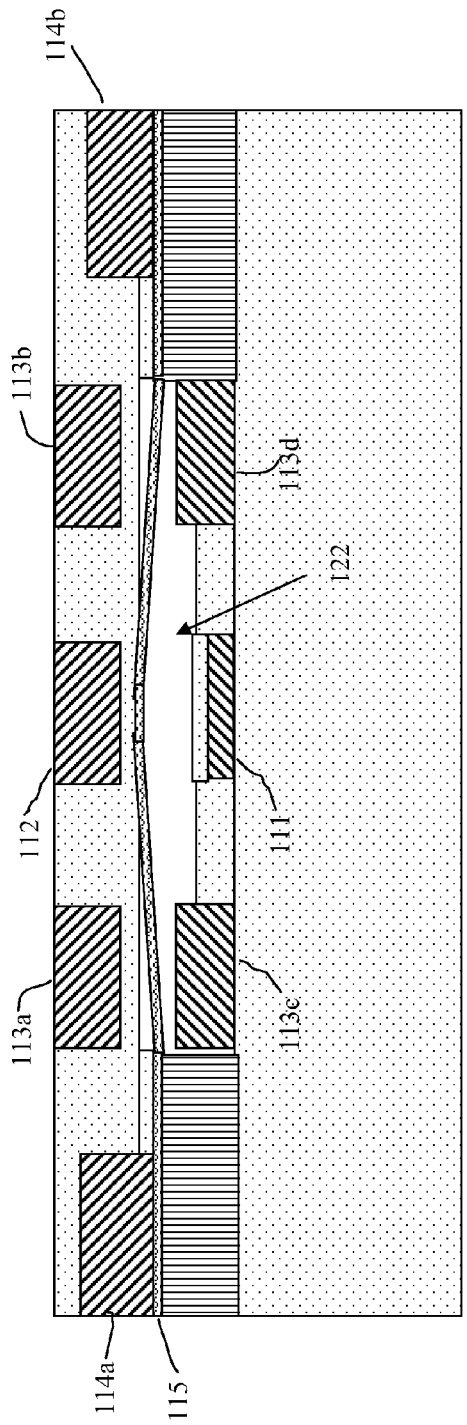

Preferred embodiments of the invention provide switching elements in which a nanotube-based switching element is included with an otherwise conventional RAM cell. The nanotube switching element may then be used to provide non-volatile storage functionality, for example, to act as a shadow ram. Moreover, the design of preferred embodiments of the nanotube switching elements may be included as extra layers on top of already formed RAM cells.

First, the nanotube switching element will be described. Second, the integration of such an element with a RAM cell will be explained.

Nanotube Switching Element

FIG. 1A is a cross sectional view of a preferred nanotube switching element 100. Nanotube switching element includes a lower portion having an insulating layer 117, control electrode 111, output electrodes 113c,d. Nanotube switching element further includes an upper portion having release electrode 112, opposing output electrodes 113a,b, and signal electrodes 114a,b. A nanotube channel element 115 is positioned between and held by the upper and lower portions.

Release electrode 112 is made of conductive material and is separated from nanotube channel element 115 by an insulating material 119. The channel element 115 is separated from the facing surface of insulator 119 by a gap height G102.

Opposing output electrodes 113a,b are made of conductive material and are separated from nanotube channel element 115 by insulating material 119.

Output electrodes 113c,d are likewise made of conductive material and are separated from nanotube channel element 115 by a gap height G103. Notice that the output electrodes 113c,d are not covered by insulator.

Control electrode 111 is made of conductive material and is separated from nanotube channel element 115 by an insulating layer (or film) 118. The channel element 115 is separated from the facing surface of insulator 118 by a gap height G104.

Signal electrodes 114a,b each contact the nanotube channel element 115 and can therefore supply whatever signal is on the signal electrode to the channel element 115. This signal may be a fixed reference signal (e.g., $V_{DD}$ or Ground) or varying (e.g., a Boolean discrete value signal that can change). Only one of the electrodes 114a,b need be connected, but both may be used to reduce effective resistance.

Nanotube channel element 115 is a lithographically-defined article made from a porous fabric of nanotubes (more below). It is electrically connected to signal electrodes 114a, b. The electrodes 114a,b and support 116 pinch or hold or pin the channel element 115 at either end, and it is suspended in the middle in spaced relation to the output electrodes 113a-d and the control electrode 111 and release electrode 112. The spaced relationship is defined by the gap heights G102-G104 identified above. For certain embodiments, the length of the suspended portion of channel element 115 is about 300 to 350 nm.

Under certain embodiments the gaps G103, G104, G102 are in the range of 5-30 nm. The dielectric on terminals 112, 111, and 113a and 113b are in the range of 5-30 nm, for example. The carbon nanotube fabric density is approximately 10 nanotubes per 0.2×0.2 um area, for example. The suspended length of the nanotube channel element is in the range of 300 to 350 nm, for example. The suspended length to gap ratio is about 5 to 15 to 1 for non-volatile devices, and less than 5 for volatile operation, for example.

FIG. 1B is a plan view or layout of nanotube switching element 100. As shown in this figure, electrodes 113b,d are electrically connected as depicted by the notation 'X' and item 102. Likewise opposing output electrodes 113a,c are connected as depicted by the 'X'. In preferred embodiments the electrodes are further connected by connection 120. All of the output electrodes collectively form an output node 113 of the switching element 100.

Figure 1D:
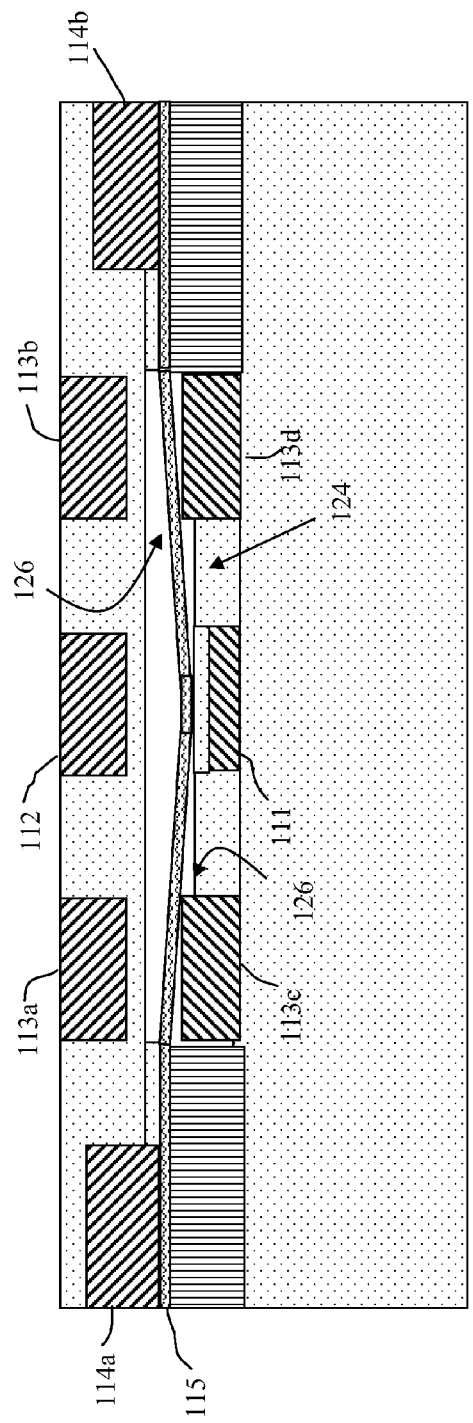

Under preferred embodiments, the nanotube switching element 100 of FIGS. 1A and 1B operates as shown in FIGS. 1C and D. Specifically, nanotube switching element 100 is in an OPEN (OFF) state when nanotube channel element is in position 122 of FIG. 1C. In such state, the channel element 115 is drawn into mechanical contact with dielectric layer 119 via electrostatic forces created by the potential difference between electrode 112 and channel element 115. Opposing output electrodes 113a,b are in mechanical contact (but not electrical contact) with channel element 115. Nanotube switching element 100 is in a CLOSED (ON) state when channel element 115 is elongated to position 124 as illustrated in FIG. 1D. In such state, the channel element 115 is drawn into mechanical contact with dielectric layer 118 via electrostatic forces created by the potential difference between electrode 111 and channel element 115. Output electrodes 113c,d are in mechanical contact and electrical contact with channel element 115 at regions 126. Consequently, when channel element 115 is in position 124, signal electrodes 114a and 114b are electrically connected with output terminals 113c,d via channel element 115, and the signal on electrodes 114 a,b may be transferred via the channel (including channel element 115) to the output electrodes 113c,d.

By properly tailoring the geometry of nanotube switching element 100, the nanotube switching element 100 may be made to behave as a non-volatile or a volatile switching element. By way of example, the device state of FIG. 1D may be made to be non-volatile by proper selection of the length of the channel element relative to the gap G104. (The length and gap are two parameters in the restoring force of the elongated, deflected channel element 115.) Length to gap ratios of greater than 5 and less than 15 are preferred for non-volatile device; length to gap ratios of less than 5 are preferred for volatile devices.

The nanotube switching element 100 operates in the following way. If signal electrode 114 and control electrode 111 (or 112) have a potential difference that is sufficiently large (via respective signals on the electrodes), the relationship of signals will create an electrostatic force that is sufficiently large to cause the suspended, nanotube channel element 115 to deflect into mechanical contact with electrode 111 (or 112). (This aspect of operation is described in the incorporated patent references.) This deflection is depicted in FIGS. 1D (and 1C). The attractive force stretches and deflects the nanotube fabric of channel element 115 until it contacts the insulated region 118 of the electrode 111. The nanotube channel element is thereby strained, and there is a restoring tensil force, dependent on the geometrical relationship of the circuit, among other things.

By using appropriate geometries of components, the switching element 100 then attains the closed, conductive state of FIG. 1D in which the nanotube channel 115 mechanically contacts the control electrode 111 and also output electrode 113c,d. Since the control electrode 111 is covered with insulator 118 any signal on electrode 114 is transferred from the electrode 114 to the output electrode 113 via the nanotube channel element 115. The signal on electrode 114 may be a varying signal, a fixed signal, a reference signal, a power supply line, or ground line. The channel formation is controlled via the signal applied to the electrode 111 (or 112). Specifically the signal applied to control electrode 111 needs to be sufficiently different in relation to the signal on electrode 114 to create the electrostatic force to deflect the nanotube channel element to cause the channel element 115 to deflect and to form the channel between electrode 114 and output electrode 113, such that switching element 100 is in the CLOSED (ON) state.

In contrast, if the relationship of signals on the electrode 114 and control electrode 111 is insufficiently different, then the nanotube channel element 115 is not deflected and no conductive channel is formed to the output electrode 113. Instead, the channel element 115 is attracted to and physically contacts the insulation layer on release electrode 112. This OPEN (OFF) state is shown in FIG. 1C. The nanotube channel element 115 has the signal from electrode 114 but this signal is not transferred to the output node 113. Instead, the state of the output node 113 depends on whatever circuitry it is connected to and the state of such circuitry. The state of output node 113 in this regard is independent of channel element voltage from signal electrode 114 and nanotube channel element 115 when the switching element 100 is in the OPEN (OFF) state.

If the voltage difference between the control electrode 111 (or 112) and the channel element 115 is removed, the channel element 115 returns to the non-elongated state (see FIG. 1A) if the switching element 100 is designed to operate in the volatile mode, and the electrical connection or path between the electrode 115 to the output node 113 is opened.

Preferably, if the switching element 100 is designed to operate in the non-volatile mode, the channel element is not operated in a manner to attain the state of FIG. 1A. Instead, the electrodes 111 and 112 are expected to be operated so that the channel element 115 will either be in the state of FIG. 1C or 1D.

The output node 113 is constructed to include an isolation structure in which the operation of the channel element 115 and thereby the formation of the channel is invariant to the state of the output node 113. Since in the preferred embodiment the channel element is electromechanically deflectable in response to electrostatically attractive forces, a floating output node 113 in principle could have any potential. Consequently, the potential on an output node may be sufficiently different in relation to the state of the channel element 115 that it would cause deflection of the channel element 115 and disturb the operation of the switching element 100 and its channel formation; that is, the channel formation would depend on the state of an unknown floating node. In the preferred embodiment this problem is addressed with an output node that includes an isolation structure to prevent such disturbances from being caused.

Specifically, the nanotube channel element 115 is disposed between two oppositely disposed electrodes 113b,d (and also 113 a,c) of equal potential. Consequently, there are equal but opposing electrostatic forces that result from the voltage on the output node. Because of the equal and opposing electrostatic forces, the state of output node 113 cannot cause the nanotube channel element 115 to deflect regardless of the voltages on output node 113 and nanotube channel element 115. Thus, the operation and formation of the channel is made invariant to the state of the output node.

The nanotube switching element described above, along with various alternatives to such, is explained in greater detail in U.S. patent application Ser. No. 10/918,085, filed on Aug. 13, 2004, entitled Nanotube-Based Switching Elements with Multiple Controls, which is hereby incorporated by reference in its entirety.

Ram with Nanotube Switching Element

In preferred versions, storage elements are constructed from conventional storage cell designs, for example using CMOS transistors, with additional nanotube-based non-volatile switching elements like those described above. In preferred versions, the storage circuitry operates using non-volatile switching of nanotubes.

However, 4-terminal device 100 is non-volatile and also includes a release node R. The outputs have opposing electrodes. The input electrode I has a dielectric layer over it so the CNT comes in physical but not electrical contact with the input electrode. The release electrode R has a dielectric layer under it so the CNT comes in physical but not electrical contact with the release electrode.

The 4-terminal non-volatile CNT device may be used as a shadow device, for example, on each of the flip flop nodes of SRAM cells. These 4-terminal devices are added at or near the end of the process for an SRAM, and are used to store information when power is lost or removed.

Figure 2:
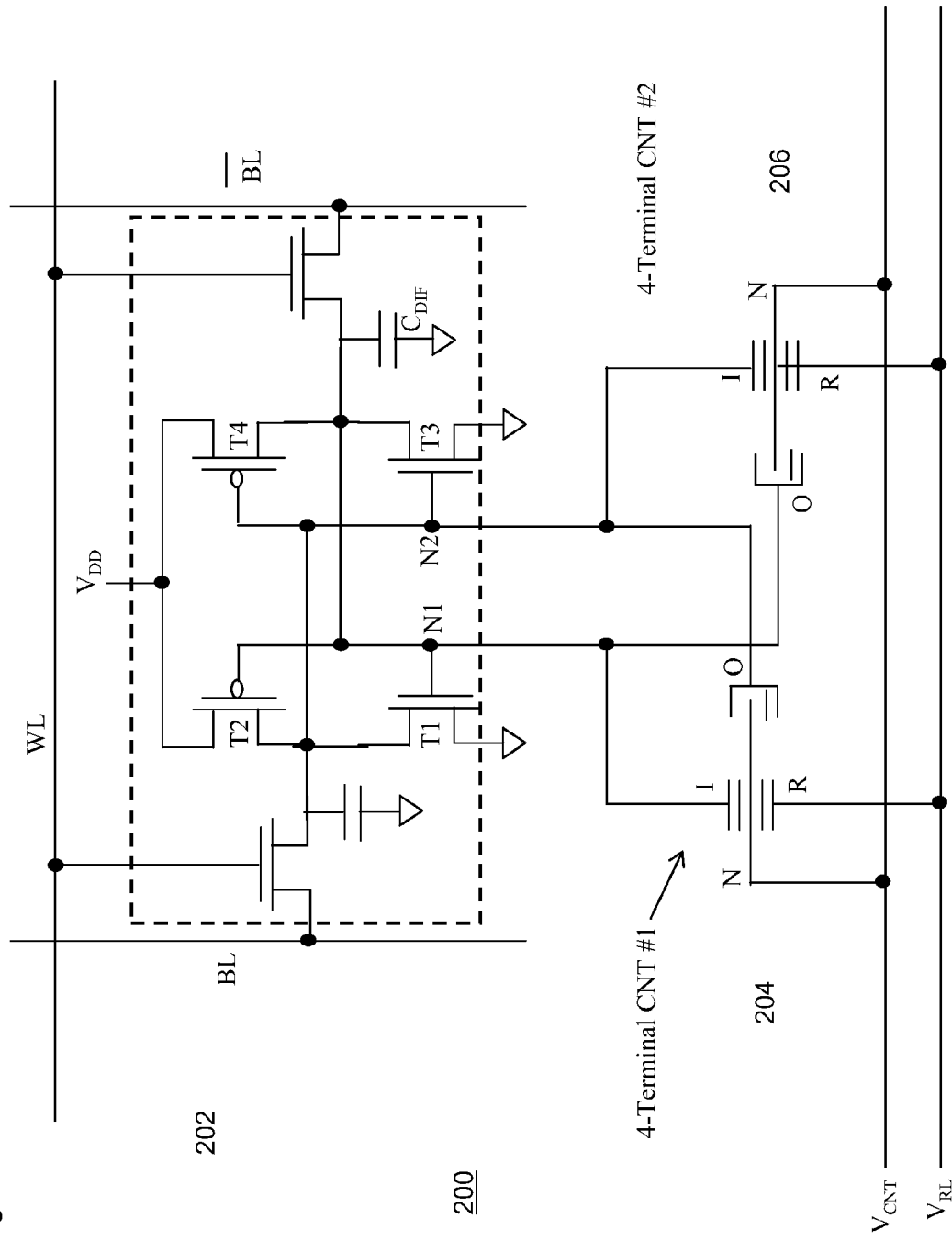
FIG. 2 is a schematic view of a non-volatile random access storage element in accordance with certain embodiments of the invention.

FIG. 2 illustrates a memory cell 200 having a flip-flop based non-volatile RAM cell with an SRAM structure 202 and two CNT 4-terminal structures 204 and 206, one for each node N1 and N2 of the flip flop cell 202. See U.S. patent application Ser. No. 10/918,085, filed on Aug. 13, 2004, entitled Nanotube-Based Switching Elements with Multiple Controls. This implementation offers various advantages discussed above because the CNTs can be added to an existing SRAM product and added to existing wafers. Operation is described below. The assumptions for this discussion of the operation of this implementation are as follows:

The CNT switching elements 204 and 206 are in a released state (CNT in contact with the insulator of release plate R) during SRAM operation, prior to the STORE operation The CNT voltage $V_{CNT}$ applied to CNT channel element N is at $V_{DD}/2$ so that the FF 202 does not activate the CNTs prior to the STORE operation The STORE operation for initially storing data in the cell, is as follows:

STORE:
  SRAM operation is stopped
  The CNT voltage $V_{CNT}$ transitions from $V_{DD}/2$ to $V_{SW}$, the voltage required to switch the CNTs.
  CNT switching element activation takes place between the input I that is held at ground by the flip flop and CNT channel element N which transitions to $V_{CNT}=V_{SW}$. The CNT switching element turns ON, and voltage $V_{CNT}$ is applied to the output electrode of the CNT device by contact with CNT channel element N. The output electrode is connected to the opposite side of the flip flop which is positive.
  The CNT switching element with input voltage=0 switches, the CNT switching element output is positive, and therefore does not disturb the flip flop state. The other CNT switching element remains in the released (OFF) position
  Power supply $V_{DD}$ goes to zero The nanotube switching elements retain the logic state of the flip flop cell especially if the storage element is powered down or if the power is interrupted, for example. The procedure for recalling stored data from a storage element is as follows:

RECALL:
  The CNT switching elements 204 and 206 are powered up. $V_{CNT}=V_{DD}$
  The SRAM is powered up to $V_{DD}$
  Flip flops assume state corresponding to the logic state of the non-volatile CNT switching elements.
  CNT switching elements are reset to the erase position (in contact with oxide on release plate). This is accomplished by raising the release line voltage $V_{RL}$ to high enough voltage to overcome electrostatic forces between the input and the NT. This voltage may be greater than $V_{DD}$.
  SRAM operation resumes The inventors envision additional configurations of volatile and nonvolatile or mixed nanoelectromechanical designs depending upon the specific application, speed, power requirements and density desired. Additionally the inventors foresee the use of multiwalled carbon nanotubes or nanowires as the switching element of contact points within the switch. As the technology node decreases in size from 90 nm to 65 nm and below down to the size of individual nanotubes or nanowires the inventors foresee adapting the basic electromechanical switching elements and their operation to a generation of nanoscale devices with scaleable performance characteristics concomitant with such size reduction.

The devices and articles shown in the preceding embodiments are given for illustrative purposes only, and other techniques may be used to produce the same or equivalents thereof. Furthermore, the articles shown may be substituted with other types of materials and geometries in yet other embodiments. For example, rather than using metallic electrodes, some embodiments of the present invention may employ nanotubes. In fact, devices comprising nanotube and nanofabric articles in place of the electrodes shown above can be constructed as well.

The above embodiments utilized nanotube switching elements operating in a non-volatile manner. Volatile operation of nanofabric switches is within the scope of certain versions of the present invention, however. In addition, coordination of volatile and non-volatile elements may be advantageous for simultaneously generating logic and memory functions or as part of overall logic functionality or for improved electrical characteristics; for example, the above-described or incorporated embodiments of volatile nanotube switching elements (like the non-volatile elements) do not necessarily draw DC current and may only dissipate power when they switch.

Volatile and non-volatile switches, and switching elements of numerous types of devices, can be thus created. In certain preferred embodiments, the articles include substantially a monolayer of carbon nanotubes. In certain embodiments the nanotubes are preferred to be single-walled carbon nanotubes. Such nanotubes can be tuned to have a resistance between 0.2-100 kOhm/□ or in some cases from 100 kOh/□ to 1 GOhm/□.

The following patent references refer to various techniques for creating nanotube fabric articles and switches and are assigned to the assignee of this application. Each is hereby incorporated by reference in their entirety:

U.S. Pat. No. 6,919,592, entitled Electromechanical Memory Array Using Nanotube Ribbons and Method for Making Same;

U.S. Pat. No. 6,784,028, entitled Methods of Making Electromechanical Three-Trace Junction Devices;

U.S. Pat. No. 6,706,402, entitled Nanotube Films and Articles;

U.S. patent application Ser. No. 10/341,005, filed on Jan. 13, 2003, entitled Methods of Making Carbon Nanotube Films, Layers, Fabrics, Ribbons, Elements and Articles;

U.S. patent application Ser. No. 10/776,059, filed Feb. 11, 2004, entitled Devices Having Horizontally-Disposed Nanofabric Articles and Methods of Making The Same; and U.S. Pat. No. 6,924,538, entitled Devices Having Vertically-Disposed Nanofabric Articles and Methods of Making the Same.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A method of making a memory cell comprising:
   providing an electronic memory element capable of storing a memory state, the electronic memory having cross-coupled first and second inverters wherein an input node of the first inverter is coupled to an output node of the second inverter and the input node of the second inverter is coupled to an output node of the first inverter;
   forming first and second nanotube switching elements capable of storing a memory state, the first and second nanotube switching elements disposed over the electronic memory element;
   electrically coupling the input node of the first inverter to the control structure of the first nanotube switching element and to the second conductive terminal of the second nanotube switching element and the first conductive terminal of the second nanotube switching element is coupled to a channel voltage line; and
   electrically coupling the input node of the second inverter to the control structure of the second nanotube switching element and to the second conductive terminal of the first nanotube switching element and the first conductive terminal of the first nanotube switching element is coupled to the channel voltage line.

2. The method of claim 1 wherein forming each nanotube switching element further comprises:
   providing first and second conductive terminals;
   providing a nanotube article having at least one electrically conductive nanotube, the nanotube article physically disposed between the first and second conductive terminals; and
   providing a control circuit capable of controllably forming and unforming an electrically conductive channel between the first and second conductive terminals wherein the channel includes the nanotube article.

3. The method of claim 1 wherein providing an electronic memory element comprises providing an SRAM cell on a wafer substrate.

4. The method of claim 1 wherein the first and second inverters comprise CMOS inverters.

5. The method of claim 1 wherein the first and second nanotube switching elements are non-volatile state devices.

6. The method of claim 1 further comprising providing a control circuit capable of operating the memory cell in a shadow memory mode wherein the shadow memory mode transfers a state of the electronic memory element to a state of the nanotube switching elements.

7. The method of claim 6, further comprising providing a voltage line to supply voltage used by the electronic memory element, wherein the control circuit is capable of operating the memory cell in a recall mode, and wherein the recall mode transfers the state of the nanotube switching elements to the state of the electronic memory element.

* * * * *